(12) United States Patent
Price et al.

(10) Patent No.: US 12,032,029 B2
(45) Date of Patent: Jul. 9, 2024

(54) BATTERY MANAGEMENT SYSTEM (BMS) AND APPLICATION

(71) Applicant: IRP NEXUS GROUP LTD, Nes Ziona (IL)

(72) Inventors: Paul Price, Nes-Ziona (IL); Shmuel Ben Yaakov, Tel Yitzhak (IL)

(73) Assignee: IRP NEXUS GROUP LTD., Nes Ziona (IL)

( * ) Notice: Subject to any disclaimer, the term of this patent is extended or adjusted under 35 U.S.C. 154(b) by 0 days.

(21) Appl. No.: 17/907,890

(22) PCT Filed: Mar. 22, 2021

(86) PCT No.: PCT/IL2021/050315
§ 371 (c)(1),
(2) Date: Aug. 29, 2022

(87) PCT Pub. No.: WO2021/191894
PCT Pub. Date: Sep. 30, 2021

(65) Prior Publication Data
US 2023/0125811 A1   Apr. 27, 2023

(30) Foreign Application Priority Data

Mar. 22, 2020 (IL) .......................................... 273496

(51) Int. Cl.
*H01M 10/48* (2006.01)
*G01R 31/3835* (2019.01)
(Continued)

(52) U.S. Cl.
CPC ...... *G01R 31/3835* (2019.01); *H01M 10/441* (2013.01); *H01M 10/48* (2013.01);
(Continued)

(58) Field of Classification Search
CPC .................. G01R 31/3835; H01M 10/441; H01M 10/48; H02J 7/0016
(Continued)

(56) References Cited

U.S. PATENT DOCUMENTS 3,624,481 A * 11/1971 Macharg ........... H02J 7/007182
320/153
3,927,361 A * 12/1975 Macharg ........... H02J 7/007182
320/149
(Continued)

FOREIGN PATENT DOCUMENTS

CN 102162834 A * 8/2011
CN 105871006 A * 8/2016
(Continued)

*Primary Examiner* — John T Trischler
(74) *Attorney, Agent, or Firm* — Saliwanchik, Lloyd & Eisenschenk (57) ABSTRACT

A battery management system, comprising a bank of serially connected battery cells having a lower most cell connected to ground and an uppermost cell connected to one port of a load, the other port of which being connected to ground; circuitry for sampling the output voltage of a selected battery cell; a voltage to current converter for receiving the sampled battery cell output voltage, which consists of a current source that outputs current being proportional to the sampled output voltage a predetermined resistor, connected between the current source output and ground, into which the output current of the current source is fed; a control circuit, adapted to measure the voltage generated across the predetermined resistor with respect to ground; determine whether or not the selected battery cell is fully charged according to the difference between the measured voltage and a predetermined threshold voltage; repeat the process for additional battery cells of the bank.

12 Claims, 7 Drawing Sheets (51) Int. Cl.
*H01M 10/44* (2006.01)
*H02J 7/00* (2006.01)
*H03F 3/45* (2006.01)
*H01M 10/42* (2006.01)

(52) U.S. Cl.
CPC ........ *H02J 7/0016* (2013.01); *H03F 3/45376* (2013.01); *H01M 2010/4271* (2013.01); *H02J 7/0013* (2013.01); *H02J 7/0049* (2020.01)

(58) Field of Classification Search
USPC .................................................... 320/116
See application file for complete search history.

(56) References Cited

U.S. PATENT DOCUMENTS

| | | | | |
|---|---|---|---|---|
| 4,415,775 A * | 11/1983 | Nijman | ............... | H04M 19/005 307/90 |
| 4,430,602 A * | 2/1984 | Ohmori | ................. | H05B 41/32 396/206 |
| 4,659,997 A | 4/1987 | Ferland et al. | | |
| 5,546,003 A * | 8/1996 | Noworolski | ........ | G01R 31/396 324/434 |
| 5,914,606 A * | 6/1999 | Becker-Irvin | ....... | G01R 31/396 340/636.15 |
| 6,121,752 A * | 9/2000 | Kitahara | ................. | H02J 7/005 320/122 |
| 6,157,170 A * | 12/2000 | Noda | ................ | G01R 31/3828 320/132 |
| 6,211,650 B1 * | 4/2001 | Mumaw | ................ | H02J 7/0016 320/120 |
| 6,297,618 B2 * | 10/2001 | Emori | .................. | H02J 7/0048 320/132 |
| 6,497,974 B2 * | 12/2002 | Fuglevand | .......... | H01M 8/0494 320/167 |
| 7,196,523 B1 * | 3/2007 | Yamada | ............. | G01R 31/3832 324/428 |
| 7,498,868 B2 * | 3/2009 | Sobue | .................. | G05F 3/265 327/543 |
| 7,551,003 B2 * | 6/2009 | Sobue | .................. | G05F 3/265 327/66 |
| 7,759,903 B2 * | 7/2010 | Kamata | ................ | G01R 31/396 320/152 |
| 7,859,223 B2 * | 12/2010 | Gorbold | ............... | G01R 31/396 320/119 |
| 7,990,154 B2 * | 8/2011 | Ohnuki | ............ | G01R 19/16542 324/426 |
| 8,130,000 B2 * | 3/2012 | Botker | ................. | G01R 31/396 324/429 |
| 8,212,536 B2 * | 7/2012 | Burns | ................... | H02M 1/088 323/224 |
| 8,233,250 B2 * | 7/2012 | Burns | .................. | H03K 17/102 361/91.1 |
| 8,253,383 B2 * | 8/2012 | Li | ........................ | G01R 31/396 320/134 |
| 8,264,200 B2 * | 9/2012 | Lum-Shue-Chan | ................... | G01R 31/396 320/116 |
| 8,350,529 B2 * | 1/2013 | Loncarevic | ........... | H02J 7/0016 320/122 |
| 8,593,128 B2 * | 11/2013 | Burns | ................. | H03K 17/102 323/224 |
| 8,634,171 B2 * | 1/2014 | Burns | .................. | H03K 17/102 361/91.1 |
| 8,704,525 B2 * | 4/2014 | Lyles | ............. | G01R 19/16542 324/433 |
| 8,749,244 B2 * | 6/2014 | Hauser | ................ | G01R 31/396 324/426 |
| 8,841,888 B2 * | 9/2014 | Li | ........................ | H02J 7/0031 320/162 |
| 9,091,736 B2 * | 7/2015 | Kadirvel | ............ | H02J 7/0013 |
| 9,548,628 B2 * | 1/2017 | Ben Aharon | ......... | H02J 7/342 |
| 9,735,567 B2 * | 8/2017 | Muramoto | ......... | G01R 31/3835 |
| 9,866,050 B2 * | 1/2018 | Brandt | ...................... | H02J 7/00 |
| 10,177,581 B2 * | 1/2019 | Yamazaki | ............ | H02J 7/0016 |
| 10,288,694 B2 * | 5/2019 | Miyamoto | ......... | G01R 31/388 |
| 10,396,570 B2 | 8/2019 | Loncarevic | | |
| 10,594,146 B2 * | 3/2020 | Shibata | ................. | H02J 7/0036 |
| 10,630,067 B2 * | 4/2020 | Muramoto | ......... | G01R 31/3835 |
| 10,843,568 B2 * | 11/2020 | Han | ........................ | B60L 15/20 |
| 10,862,317 B2 * | 12/2020 | Loncarevic | ........... | H02J 7/0016 |
| 11,105,860 B2 * | 8/2021 | Takeshita | ............... | H03K 21/40 |
| 11,353,484 B2 * | 6/2022 | Choi | ................... | G01R 19/165 |
| 11,370,308 B1 * | 6/2022 | Ben-Yaakov | ......... | H02M 3/158 |
| 11,495,976 B2 * | 11/2022 | Eo | ......................... | H02J 7/005 |
| 2001/0011881 A1 * | 8/2001 | Emori | .................... | H02J 7/0048 320/116 |
| 2002/0177018 A1 * | 11/2002 | Fuglevand | ........ | H01M 8/04559 429/432 |
| 2006/0087287 A1 | 4/2006 | Thrap | | |
| 2007/0030056 A1 * | 2/2007 | Sobue | ..................... | G05F 3/265 327/543 |
| 2007/0285083 A1 * | 12/2007 | Kamata | ............... | G01R 31/3835 324/120 |
| 2008/0180106 A1 * | 7/2008 | Gorbold | ............... | G01R 31/396 324/434 |
| 2008/0238432 A1 * | 10/2008 | Botker | ................. | G01R 31/396 324/434 |
| 2008/0252266 A1 * | 10/2008 | Bolz | ................... | H02J 7/0016 320/166 |
| 2008/0265947 A1 * | 10/2008 | Sobue | .................... | G05F 3/265 327/66 |
| 2008/0284375 A1 * | 11/2008 | Nagaoka | ................ | B60L 50/64 320/116 |
| 2009/0140743 A1 * | 6/2009 | Ohnuki | ................ | G01R 31/396 324/426 |
| 2009/0243621 A1 * | 10/2009 | Kudo | .................... | B60L 3/0038 324/426 |
| 2010/0052615 A1 * | 3/2010 | Loncarevic | ........... | H02J 7/0016 320/118 |
| 2010/0173183 A1 * | 7/2010 | Kadirvel | ............... | H02J 7/0048 429/90 |
| 2010/0194345 A1 * | 8/2010 | Li | ........................ | G01R 31/396 361/88 |
| 2010/0289497 A1 * | 11/2010 | Lum-Shue-Chan | ......... | G01R 31/396 324/426 |
| 2011/0012605 A1 * | 1/2011 | Lyles | ................... | G01R 31/396 324/433 |
| 2011/0148200 A1 * | 6/2011 | Burns | ................... | H02M 3/158 307/43 |
| 2011/0148368 A1 * | 6/2011 | Burns | ................... | H02M 3/158 323/225 |
| 2012/0038364 A1 * | 2/2012 | Hauser | ................. | H01M 10/48 324/426 |
| 2012/0229102 A1 * | 9/2012 | Burns | ................... | H02M 3/158 323/224 |
| 2012/0257311 A1 * | 10/2012 | Burns | ............... | H03K 17/08142 361/18 |
| 2012/0319654 A1 * | 12/2012 | Li | ........................ | H02J 7/00308 320/118 |
| 2013/0154546 A1 * | 6/2013 | Kleczewski | ........... | H02J 7/2437 320/107 |
| 2013/0207613 A1 * | 8/2013 | Loncarevic | ........... | H02J 7/0016 320/134 |
| 2013/0300371 A1 * | 11/2013 | Bills | .................... | H02J 7/0014 320/134 |
| 2014/0055896 A1 * | 2/2014 | Muramoto | ......... | G01R 31/3835 361/86 |
| 2014/0132069 A1 * | 5/2014 | Ben Aharon | ........... | H02J 1/108 307/26 |
| 2015/0035487 A1 * | 2/2015 | Kawamoto | ........... | H02J 7/0016 320/112 |
| 2015/0380952 A1 | 12/2015 | Brandt et al. | | |
| 2016/0261127 A1 * | 9/2016 | Worry | ................... | H02J 7/0029 |
| 2017/0033570 A1 * | 2/2017 | Yamazaki | ............ | H02J 7/0016 |
| 2017/0104230 A1 * | 4/2017 | Aoki | .................... | H01M 8/0267 |
| 2017/0155254 A1 * | 6/2017 | Katayama | ........... | H02J 7/00712 |
| 2017/0302069 A1 * | 10/2017 | Muramoto | ............ | H02H 7/18 |
| 2018/0076638 A1 * | 3/2018 | Shibata | ................. | H02J 7/0036 |

(56) References Cited

U.S. PATENT DOCUMENTS

| | | | |
|---|---|---|---|
| 2018/0172771 A1* | 6/2018 | Miyamoto | G01R 31/382 |
| 2019/0086475 A1* | 3/2019 | Takeshita | G01R 31/392 |
| 2019/0285669 A1* | 9/2019 | Furukawa | H01M 10/48 |
| 2019/0379214 A1* | 12/2019 | Loncarevic | H02J 7/0016 |
| 2020/0295578 A1* | 9/2020 | Bober | H02J 7/0016 |
| 2020/0373629 A1* | 11/2020 | Li | G01R 31/54 |
| 2020/0412154 A1* | 12/2020 | Jang | H01M 10/4207 |
| 2021/0018567 A1* | 1/2021 | Horiguchi | G01R 27/02 |
| 2021/0050731 A1* | 2/2021 | Loncarevic | H02J 7/0016 |
| 2021/0098998 A1* | 4/2021 | Eo | G01R 31/3835 |
| 2021/0231713 A1* | 7/2021 | Choi | G01R 35/00 |
| 2023/0106428 A1* | 4/2023 | Ben Yaakov | B60L 50/60 320/117 |
| 2023/0127930 A1* | 4/2023 | Jelinek | H02M 1/32 307/43 |

FOREIGN PATENT DOCUMENTS

| | | |
|---|---|---|
| DE | 10 2014 017 079 A1 | 6/2015 |
| EP | 2 700 965 B1 | 2/2014 |
| JP | 3697986 B2 * | 9/2005 |
| JP | 4760449 B2 * | 8/2011 |
| JP | 2014020977 A * | 2/2014 |

* cited by examiner

BATTERY MANAGEMENT SYSTEM (BMS) AND APPLICATION

CROSS REFERENCE TO RELATED APPLICATIONS

This application is a National Stage Application of International Application Number PCT/IL2021/050315, filed Mar. 22, 2021; that claims priority to Israel Patent Application No. 273496, filed on Mar. 22, 2020.

FIELD OF THE INVENTION

The present invention relates to the field of Battery Management Systems (BMS). More particularly, the present invention relates to a system and method for controlling the charging level of a bank of serially connected batteries and performing equalization of the charges in the batteries.

BACKGROUND OF THE INVENTION

An array of batteries connected in series (in order to obtain high voltages) requires monitoring of the state of the batteries charge level. There is a need to avoid a situation where the state of charge of the batteries is not equal, because if there is no balance between the charge the batteries in the array, a situation may arise where a battery that is already fully charged will be charged again and will be overcharged, and a battery which does not charge at all, will remain discharged. The state of battery overcharging is detrimental to the battery and shortens its life, and there is a proliferation of parameters and uneven aging of the batteries. Therefore, there is a need to perform equalization of the state of charge levels among these batteries.

There are several conventional methods to perform equalization of the charge levels among the batteries: active methods and passive methods. The active methods use converters for transferring energy from one cell to another. These methods are very complex and expensive to implement.

There are several passive equalization conventional methods:

1. Checking the voltage of each of the batteries in the array, usually while charging, and if the voltage of one of the batteries is too high (i.e. the battery reached its maximum charge), the battery does not continue to be charged by the same current. A bypass is made to the current, and the current is being dissipated on a resistor. For this purpose, an integrated circuit (IC) is used and can be connected to several cells. The IC checks the voltage, and when needed, it starts to discharge the required battery cell. Because the IC can only reach 10 to 12 batteries, depending on the type of IC, several ICs are required with communication between them in order to reach all the butteries in the array, along with a sending a central command, from which information about the batteries is known.

The information is transmitted via a communication line to a system that monitors the information. The disadvantages of this method are that it is expensive, there is a need for an A/D converter to each battery group, while every group of batteries needs processors.

When there are a lot of batteries, there is a need to replicate these electric batteries for each battery and the price becomes very expensive.

2. Measuring the cell with respect to the ground with a difference amplifier. This method can be used with a multiplexer for monitoring, an A/D converter, measuring all voltages and the charge reduction can be controlled via a voltage-discharge transistor. This method is much simpler, but the problem with this method is that when there are many cells, the amplifier is unable to measure high voltages, i.e. the amplifier's input voltage cannot be high, and therefore very extensive voltage divisions are needed, so that the voltage at this point will be low. The resistor ratios should be those that produce low voltage at the input of the amplifier (low common mode voltage), within its power limits. The particular precision required for each resistor results in very low measurement accuracy, because the resistor precision must be multiplied by the same factor whose voltage is reduced. The measurement errors in this method become very large and therefore, unacceptable.

It is therefore an object of the present invention to provide a system and method for monitoring on charging state of a bank of batteries.

It is another object of the present invention to provide a system and method for performing equalization of the charges of the batteries in a batteries' bank.

Other objects and advantages of the invention will become apparent as the description proceeds.

SUMMARY OF THE INVENTION

A method for accurately monitoring the charging level of a bank of serially connected battery cells, comprising the steps of:
 a) providing a bank of serially connected battery cells having a lower most cell connected to ground and an uppermost cell connected to one port of a load, the other port of which being connected to ground;
 b) sampling the output voltage of a selected battery cell;
 c) feeding the sampled battery cell output voltage into a voltage to current converter consisting of:
  c.1) a current source that outputs current being proportional to the sampled output voltage
  c.2) a predetermined resistor, connected between the current source output and ground, into which the output current of the current source is fed;
 d) measuring the voltage generated across the predetermined resistor with respect to ground;
 e) determining whether or not the selected battery cell is fully charged according to the difference between the measured voltage and a predetermined threshold voltage; and
 f) repeating steps b) to d) above for additional battery cells of the bank.

The output voltages of all sampled battery cells may be fed into a multiplexer, which forwards the output voltages to a processor that outputs the voltages of all sampled battery cells, each at a predetermined timing.

In one aspect, the voltage to current converter is implemented by:
 a) providing an operational amplifier, which is suitable to operate in high voltage levels;
 b) connecting the negative port of the selected battery cell to an input of the operational amplifier;
 c) providing a p-channel FET;
 d) connecting the source of the p-channel FET to the positive port of the selected battery cell via a first serial resistor;
 e) connecting the drain of the p-channel FET to the ground via a second serial resistor;
 f) connecting the gate of the p-channel FET to the output of the operational amplifier; and g) connecting a feedback line between the source of the p-channel FET and the other input of the operational amplifier.

Power supply voltages to feed DC power to the operational amplifier may be taken from the neighboring battery cells.

The lower DC supply to the operational amplifier may be taken from one battery cell being lower than the measured battery cell and the higher upper battery cell and the higher DC supply to the operational amplifier is taken from one battery cell being upper than the measured battery cell.

In one aspect, multiple packages of operational amplifiers are used for measuring groups of battery cells, while each time, taking the lower supply voltage from one battery cell below the measured group, while the remaining lowest battery cell is measured directly, with respect to ground.

Overcharging of the selected battery cell is prevented upon measuring that its output voltage is within the threshold by:

a) connecting the drain of a FET to the positive port of the selected battery cell via a first resistor and the source of the FET to the negative port of the selected battery cell;
b) connecting a shunt capacitor and a shunt resistor between the gate and source of the FET;
c) connecting a shunt Zener between the gate and source of the FET, for protecting the gate from overvoltage;
d) connecting a port of a series capacitor to the gate;
e) applying a square wave to the other port of the series capacitor and causing the shunt capacitor to be charged to a voltage that causes the FET to conduct and consume the current that normally charges the battery cell;
f) terminating the application of the square wave to the series capacitor whenever the output voltage is not within the threshold; and
g) allowing the shunt capacitor discharge via the shunt resistor and cause the FET to stop conducting, thereby returning to measuring the voltage generated across the predetermined resistor with respect to ground.

A battery management system, comprising:

a) a bank of serially connected battery cells having a lower most cell connected to ground and an uppermost cell connected to one port of a load, the other port of which being connected to ground;
b) circuitry for sampling the output voltage of a selected battery cell;
c) a voltage to current converter for receiving the sampled battery cell output voltage, consisting of:
  c.1) a current source that outputs current being proportional to the sampled output voltage
  c.2) a predetermined resistor, connected between the current source output and ground, into which the output current of the current source is fed;
d) a control circuit, adapted to:
  measure the voltage generated across the predetermined resistor with respect to ground;
  determine whether or not the selected battery cell is fully charged according to the difference between the measured voltage and a predetermined threshold voltage; and
  repeat the process for additional battery cells of the bank.

The battery management system may further further comprise:

a) a processor; and
b) a multiplexer, which is adapted to receive the output voltages of all sampled battery cells and forward the output voltages to the processor,
where the processor outputs the voltages of all sampled battery cells, each at a predetermined timing.

The battery management system may further comprise:

a) an operational amplifier, which is suitable to operate in high voltage levels, where the negative port of the selected battery cell is connected to an input of the operational amplifier;
b) a p-channel FET, where the source of the p-channel FET is connected to the positive port of the selected battery cell via a first serial resistor, the drain of the p-channel FET is connected to the ground via a second serial resistor and the gate of the p-channel FET is connected to the output of the operational amplifier; and
c) a feedback line connecting between the source of the p-channel FET and the other input of the operational amplifier.

The power supply voltages to feed DC power to the operational amplifier may be taken from the neighboring battery cells.

The lower DC supply to the operational amplifier may be taken from one battery cell being lower than the measured battery cell and the higher upper battery cell and the higher DC supply to the operational amplifier is taken from one battery cell being upper than the measured battery cell.

Multiple packages of operational amplifiers may be used for measuring groups of battery cells, while each time, taking the lower supply voltage from one battery cell below the measured group, while the remaining lowest battery cell is measured directly, with respect to ground.

The battery management system may further comprise circuitry for preventing overcharging of the selected battery cell upon measuring that its output voltage is within the threshold, the circuitry comprises:

a) a FET the drain of which being connected to the positive port of the selected battery cell via a first resistor and the source of which being connected to the negative port of the selected battery cell;
b) a shunt capacitor and a shunt resistor, being connected between the gate and source of the FET;
c) a shunt Zener being connected between the gate and source of the FET, for protecting the gate from overvoltage;
wherein a port of a series capacitor is being connected to the gate;
the circuitry is adapted to:
d) apply a square wave to the other port of the series capacitor and causing the shunt capacitor to be charged to a voltage that causes the FET to conduct and consume the current that normally charges the battery cell;
e) terminate the application of the square wave to the series capacitor whenever the output voltage is not within the threshold; and
f) allow the shunt capacitor discharge via the shunt resistor and cause the FET to stop conducting, to thereby return to measuring the voltage generated across the predetermined resistor with respect to ground.

BRIEF DESCRIPTION OF THE DRAWINGS

The above and other characteristics and advantages of the invention will be better understood through the following illustrative and non-limitative detailed description of preferred embodiments thereof, with reference to the appended drawings, wherein.

DETAILED DESCRIPTION OF THE PRESENT INVENTION

The present invention proposes a system and method for controlling the charging level of a bank of serially connected batteries and performing equalization of the charges of the batteries.

Figure 1:
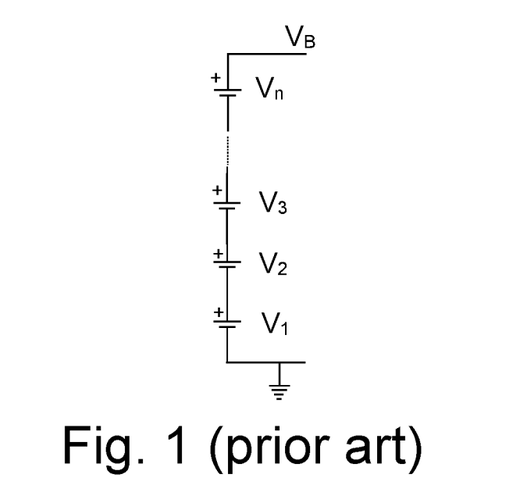
FIG. 1 (prior art) shows am array of n serially connected batteries with output voltages $V_1, \ldots, V_n$, respectively.

FIG. 1 (prior art) shows an array of n serially connected batteries with output voltages $V_1, \ldots, V_n$, respectively. The total output voltage of the array is $V_B = V_1 + \ldots + V_n$. A proper operation of the array is when all connected batteries are essentially equally charged, in order to prevent a situation when due to different manufacturing parameters and aging, some batteries will not be sufficiently charged and other batteries will be overcharged.

Figure 2:
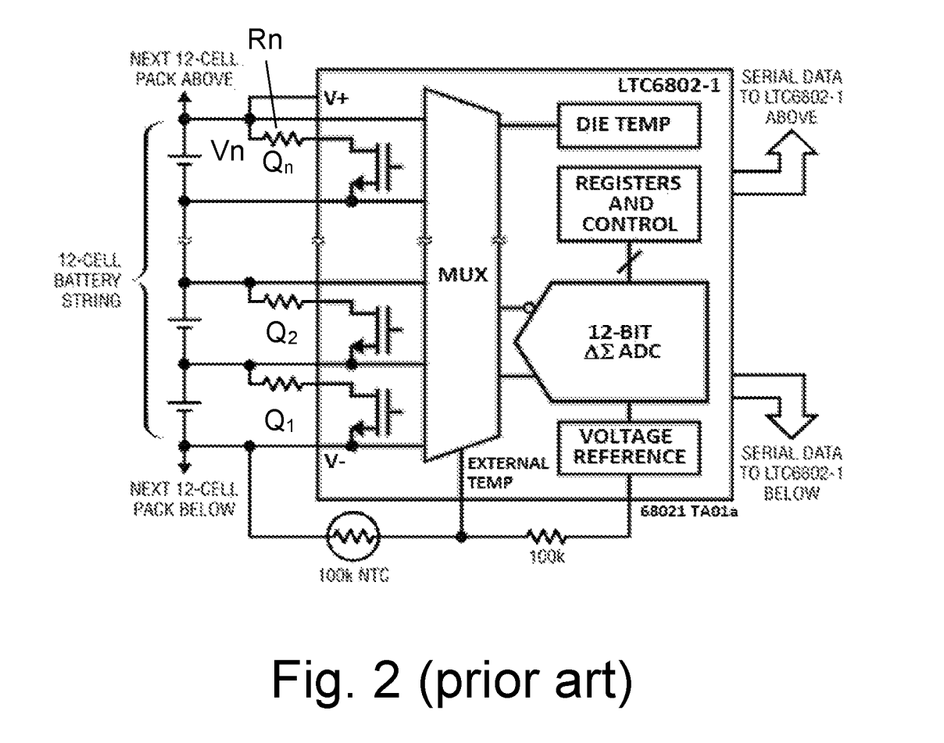
FIG. 2 (prior art) illustrates a circuitry for equalizing the charge among an array of serially connected batteries.

FIG. 2 (prior art) illustrates a circuitry for equalizing the charge among an array of 12 serially connected batteries. The circuitry measures the output voltage of each battery during charging, and if the output voltage of one of the batteries reached its upper limit, the circuit stops charging it with the same current. Instead, the current is routed into a resistor, which dissipates the power. For example, If the upper battery is fully charged, transistor Qn is switched on and most of the current is directed into resistor Rn. However, this circuitry is expensive as it contains DACs, a multiplexer and associated processing hardware.

Figure 3:
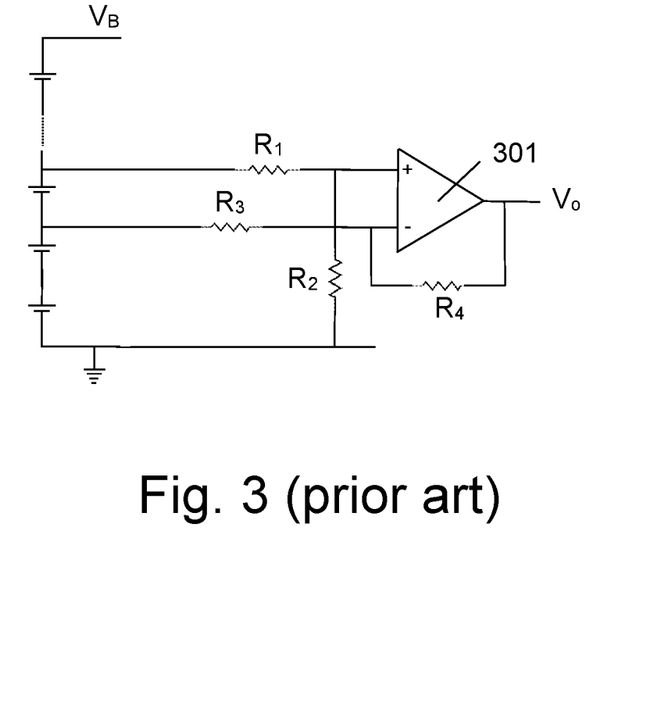
FIG. 3 (prior art) illustrates another circuitry for monitoring the charging level of an array of serially connected batteries.

FIG. 3 (prior art) illustrates another circuitry for monitoring the charging level of an array of serially connected batteries. The voltage across each battery is measured and input into a differential amplifier 301, in order to obtain the output voltage Vout of the battery at the output of the differential amplifier. However, the voltages at the ports of the upper batteries may be very high (up to 800V in electric cars as of 2020) with respect to ground, which requires using a high attenuation voltage dividers (R1/R2=R4/R3 must be large) to decrease the voltages before processed by the operational amplifier 301. This deteriorates the accuracy of the measurement of the actual voltage across each measured battery cell. For example: if the accuracy of the resistors is 0.1% and if R1/R2 is 100 then, due to the mismatch of the resistor the error in measurement will be about 20%.

Figure 4:
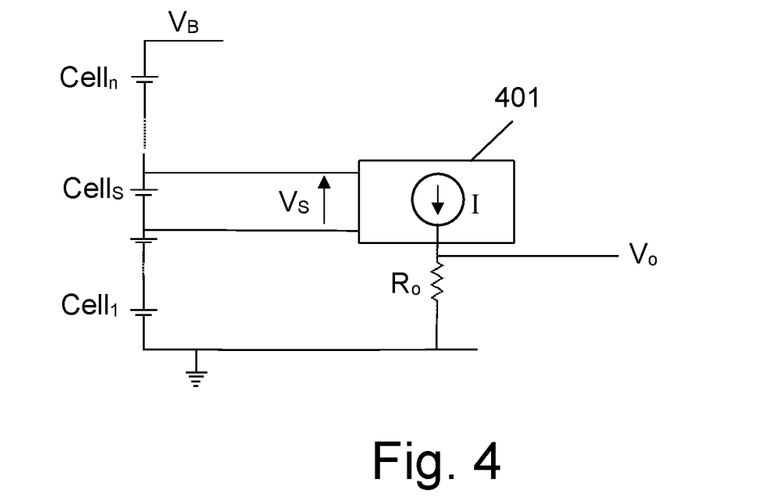
FIG. 4 illustrates a circuitry for monitoring the charging level of a single battery in an array of serially connected batteries, according to an embodiment of the invention.

FIG. 4 illustrates a circuitry for monitoring the charging level of a single battery in an array of serially connected batteries, according to an embodiment of the invention.

The array of serially connected battery cells has a lower most cell ($Cell_1$) connected to ground and an uppermost cell ($Cell_n$) connected to one port of a load. The other port of the load is connected to ground, such that the summed voltage $V_s$ of all cells (1, ..., n) feeds the load.

In this case, the proposed circuitry is generic for all battery cells, regardless their voltage level with respect to ground. The circuitry consists of a voltage to current converter 401 that outputs current I which is proportional to the battery cell voltage Vs. By using a resistor Ro to ground, the output voltage Vo can be used to know the voltage Vs. If $I = K_s \cdot V_s$, then $V_o = K_s \cdot R_o \cdot V_s$.

The circuitry comprises a control circuit (not shown), which is adapted to measure the voltage generated across the predetermined resistor $R_0$ with respect to ground, determine whether or not the selected battery cell (Cells) is fully charged according to the difference between the measured voltage and a predetermined threshold voltage. This measurement process is repeated by the controller for additional battery cells of said bank.

Figure 5:
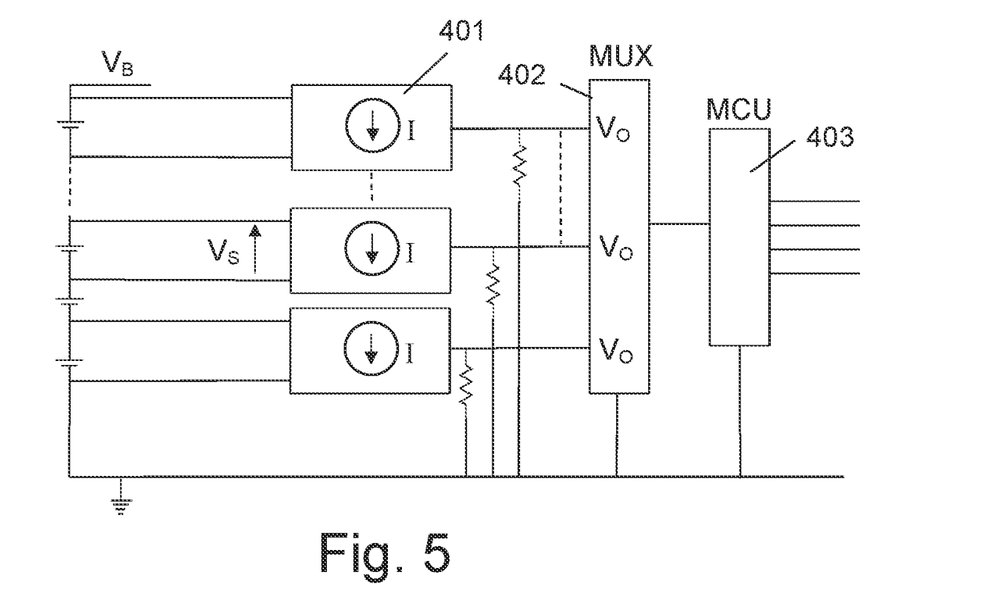
FIG. 5 illustrates a circuitry for monitoring the charging level of an array of serially connected batteries, according to an embodiment of the invention.

FIG. 5 illustrates a circuitry for monitoring the charging level of an array of serially connected batteries, according to an embodiment of the invention. The circuitry consists of n current converters 401, one for each battery cell. The output voltages are forwarded to a multiplexer 402 and then to a processor 403 which outputs the voltages of all battery cells.

Figure 6:
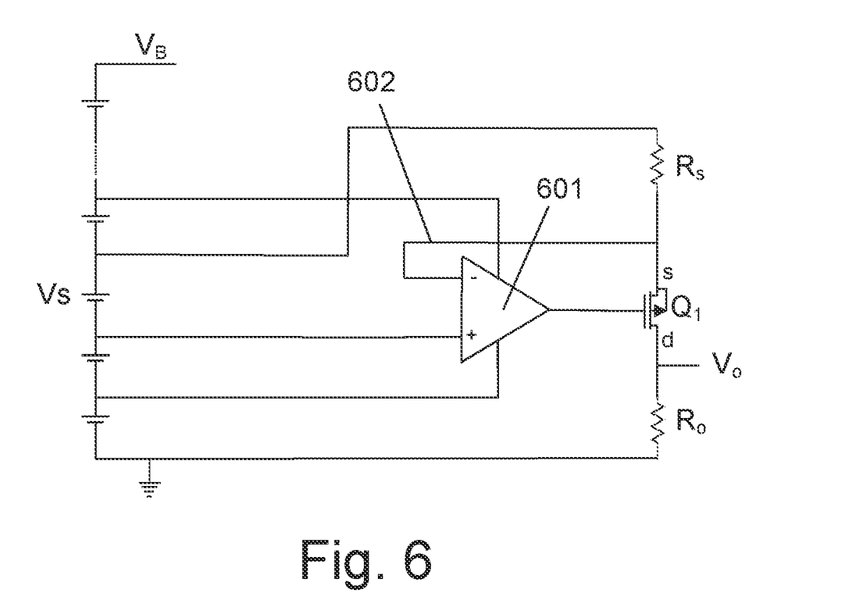
FIG. 6 illustrates the implementation of the circuitry of FIG. 4.

FIG. 6 illustrates a possible implementation of the circuitry of FIG. 4 above. The circuitry comprises an operational amplifier 601 which feeds a p-channel FET Q1, which is suitable to operate in high voltage levels (e.g., 500 V) and the power supply voltages to feed DC power to the operational amplifier 601 are taken from the neighboring batteries. One port of the measured battery is connected via a resistor Rs to the source of Q1 and the other port to one input of operational amplifier 601. A feedback line 602 is connected between the source of Q1 and the other input of operational amplifier 601. As a result, the current flowing through resistor Ro is proportional to the battery cell voltage Vs.

Figure 7:
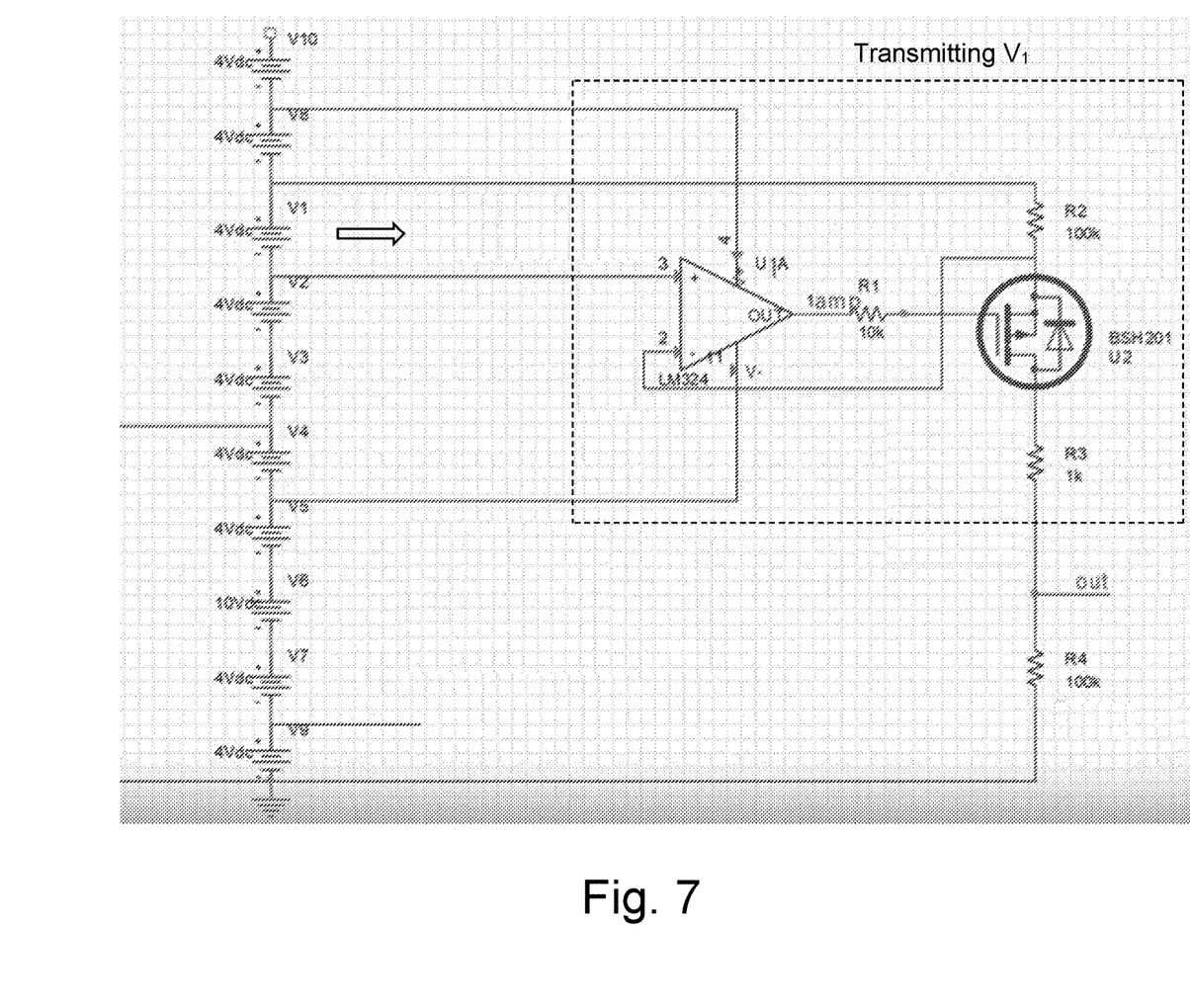
FIG. 7 illustrates the same implementation of the circuitry of FIG. 6, using actual components.

FIG. 7 illustrates the same implementation of the circuitry of FIG. 6 but using actual components. The battery voltage to be measured is V1. During normal operation, the voltage between the inputs of the operational amplifier U1 is practically zero and therefore, the voltage across resistor R2 will be identical to the battery voltage V1. Therefore, the current flowing through MOSFET U2 will be I=V1/R2 and Vout=V1·R4/R2. Operational amplifier U1 keeps the current flowing via R2 very accurate (and deviation will be compensated by U1). If R4 and R2 are selected to be equal, R4=R2, then Vout=V1. Since there are only two resistors involved, and no high ratio divider is required, the error will be very small and depends primarily on the offset voltage of amplifier and input current bias. The expected accuracy with common operational amplifiers will thus be very high (down to ±10 mV error) and independent of the cell position in the array. Such high accuracy must be obtained to evaluate the state of charge of batteries cells, such as Lithium Ion cells.

Generally, common mode voltage of the operational amplifier U1 should not be close to the voltages of its upper and lower DC supply, in order to prevent errors that may arise. This problem, may be overcome by taking the lower supply to operational amplifier U1 from one battery lower (in this example, from battery cell V5 rather that V4). The measurement of V4 can be made during the next group, in which V4 will be the upper battery cell. A package of 4 operational amplifier U1 is an off the shelf product. This way, the combination of such package with 4 corresponding MOSFETs U2 allows measuring groups of 4 battery cells.

Figure 8:
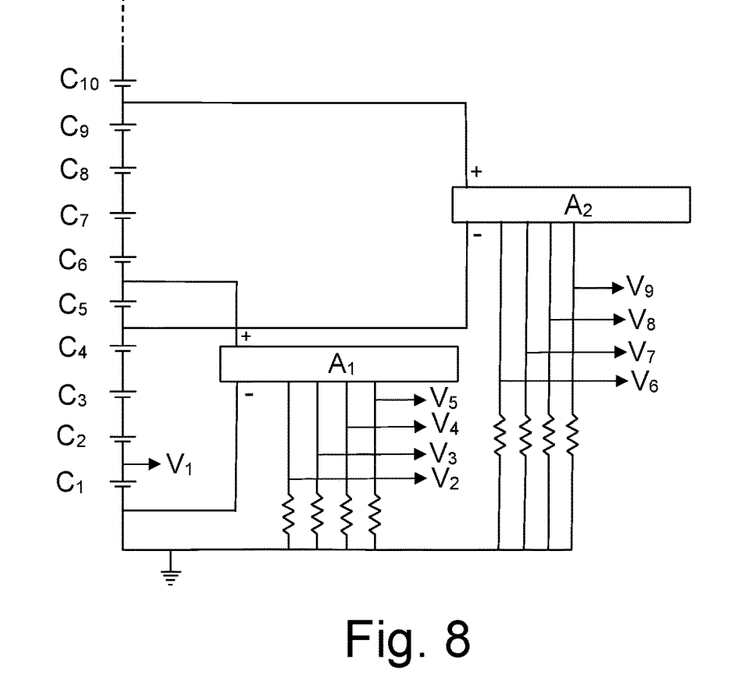
FIG. 8 shows the connection of multiple packages for measuring groups of 4 battery cells, while each time, taking the lower supply voltage from one battery cell below the measured group.

FIG. 8 shows the connection of multiple packages for measuring groups of 4 battery cells, with a four operational amplifiers per package while each time, taking the lower supply voltage from one battery cell below the measured group. The remaining lowest battery cell $C_1$ can be measured directly, since its lower voltage is grounded.

Figure 9:
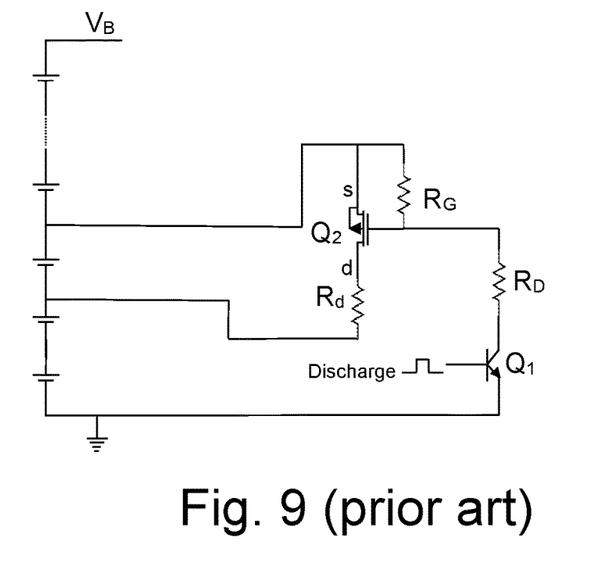
FIG. 9 (prior art) illustrates a typical current discharge circuitry, for preventing overcharging of a battery cell.
Figure 10A:
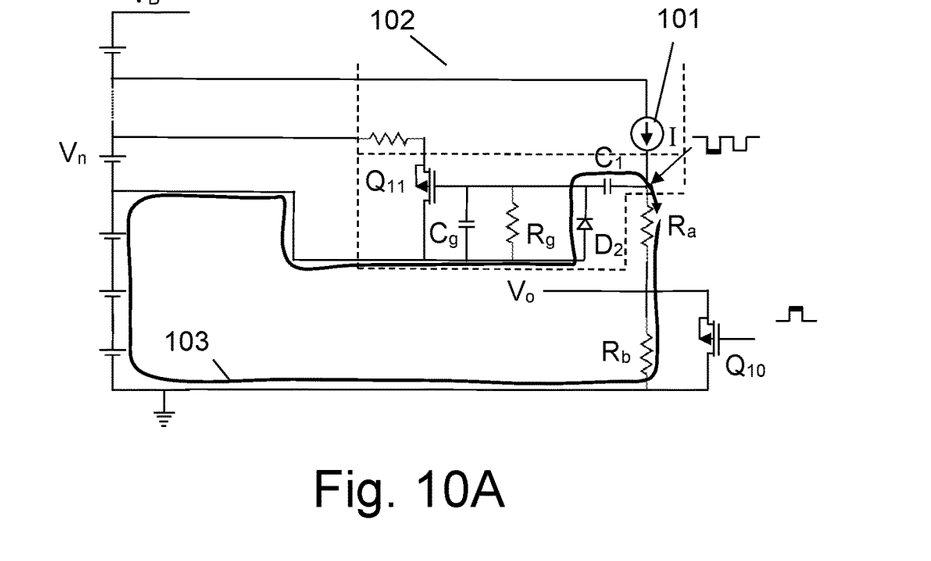
FIGS. 10A-10B illustrate a current discharge circuitry for preventing overcharging of a battery cell, according to the invention.
Figure 10B:
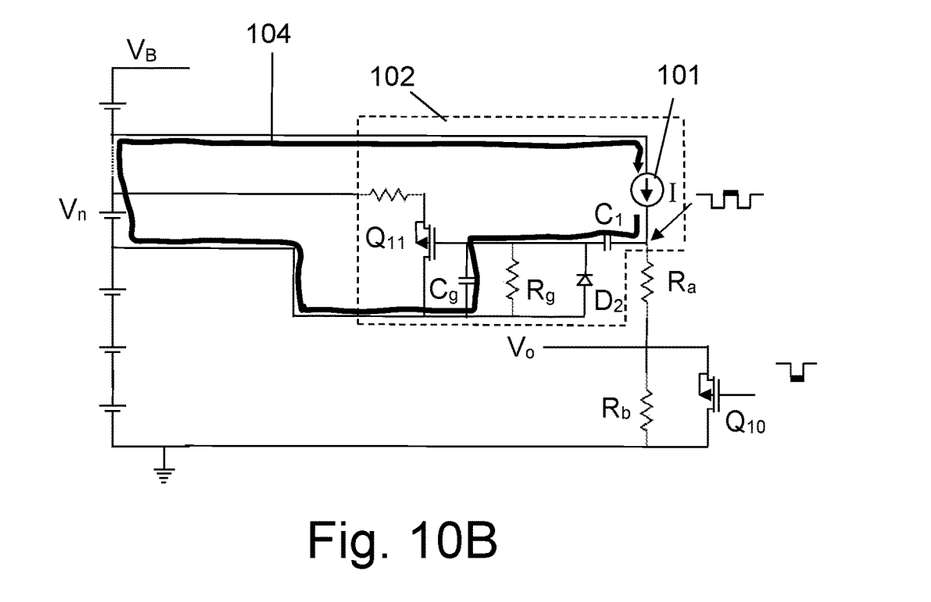

FIG. 9 (prior art) illustrates a typical current discharge circuitry, for preventing overcharging of a battery cell. After monitoring its voltage, the discharge circuit does not allow a charged battery cell to be further charged by full current. Discharge is allowed by a p-channel MOSFET Q2 which is controlled by another transistor Q1 connected between the gate of Q2 (via a resistor $R_D$) and ground. Upon discharge, Q2 conducts and the current intended to charge the battery cell is directed to resistor $R_L$ where it is dissipated. Or, in no-charge mode, the current discharge (bleeder) circuit can partially discharge a cell as might be required for equalization. The disadvantage of this prior art circuitry is that each cell requires an individual connection via $Q_1$ for discharge. Another disadvantage is that it required a p-channel MOSFET which is more expensive and has larger conduction resistance FIGS. 10A-10B illustrate a current discharge circuitry for preventing overcharging of a battery cell, according to the invention. This implementation uses an n-channel MOSFET and the same connections used for monitoring the voltage of a measured battery cell is also used for controlling the discharge for that battery cell.

The circuit comprises a transistor Q10 which applies short-circuit on resistor Rb in a predetermined rate using a square wave. Resistor Ra is fed by a current source 101 and when transistor Q10 is not conducting, the voltage at the output port of current source 101 is I·(Ra+Rb) and when transistor Q10 is conducting (i.e., Rb=0 as it is short-circuited), the voltage at the output port of current source 101 is I·Ra. As a result, the voltage at the output port of current source 101 is also a square wave with similar characteristics as the input voltage applied to the gate of Q10 (except for a DC level of I·Ra). The circuit 102 actually functions as a switched capacitor converter gate driver. The resulting square wave at the output port of current source 101 charges and discharges the capacitor C1, as a function of the low and high voltages of the applied square wave at the output port of current source 101. When the voltage at the output port of current source 101 is low, the capacitor C1 discharges via route 103 (resistor Ra, capacitor Cg) and diode D2, as shown in FIG. 10A. This results in zero voltage at the gate of Q11. When the voltage at the output port of current source 101 is high, the capacitor C1 charges via route 104 (current source 101 and capacitor Cg), as shown in FIG. 10B, such that capacitor Cg is also charged. As a result, as long as the square wave is applied to the gate of Q10, the gate of Q11 is held at higher voltage and conducts, such that the current intended to charge battery cell Vn is routed away to prevent Vn from being overcharged. Upon terminating the discharge period, the square wave applied to the gate of Q10 is stopped, capacitor Cg discharges via resistor Rg, until the gate of Q11 remains at low voltage and Q11 stops conducting. At this stage, the circuit returns back to monitoring mode, where the voltage Vo accurately reflects the voltage across the monitored battery cell Vn.

Figure 11:
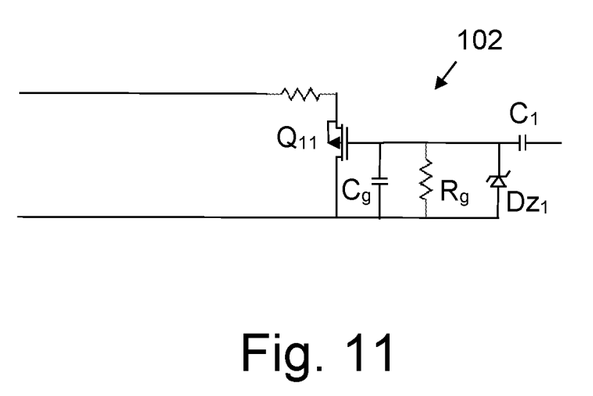
FIG. 11 illustrates a simplified equivalent model of the switched capacitor converter gate drive circuit 102, according to an embodiment of the invention.

FIG. 11 illustrates a simplified equivalent model of the switched capacitor converter gate driver circuit 102, according to an embodiment of the invention. A square wave at the output port of current source (i.e., the input port of capacitor C1) charges the capacitor Cg via capacitor C1, the gate of Q11 is held at higher voltage and conducts, such that the current intended to charge battery cell Vn is routed away to prevent Vn from being overcharged. When the voltage at the output port of current source 101 is low, the capacitor C1 discharges via Ra and the forward diode of Zener Dz1. Upon terminating of the discharge period, the square wave applied to the gate of Q10 is stopped, capacitor Cg discharges via resistor Rg, until the gate of Q11 remains at low voltage and Q11 stops conducting. At this stage, the circuit returns back to monitoring mode, where the voltage Vo accurately reflects the voltage across the monitored battery cell Vn. The Zener diode $D_{Z1}$ (rather than a diode D2 as in FIG. 10A), may optionally be added to protect the gate of Q11 from over voltage.

The above examples and description have of course been provided only for the purpose of illustrations, and are not intended to limit the invention in any way. As will be appreciated by the skilled person, the invention can be carried out in a great variety of ways, employing more than one technique from those described above, all without exceeding the scope of the invention.

The invention claimed is:
1. A method for accurately monitoring a charging level of a bank of serially connected battery cells, comprising:
   a) providing the bank of serially connected battery cells having a lower most cell connected to ground and an uppermost cell connected to one port of a load, another port of said load being connected to ground;
   b) sampling the output voltage of a selected battery cell;
   c) feeding the sampled battery cell output voltage into a voltage to current converter consisting of:
      c(1) a current source that outputs current being proportional to said sampled output voltage
      c(2) a predetermined resistor, connected between said current source output and ground, into which the output current of said current source is fed;
   d) measuring a voltage generated across said predetermined resistor with respect to ground;
   e) determining whether or not said selected battery cell is fully charged according to a difference between the measured voltage and a predetermined threshold voltage;
   f) repeating steps b) to d) above for additional battery cells of said bank; and
   g) preventing overcharging of the selected battery cell upon measuring that its output voltage is within the threshold by:
      g(1) connecting the drain of a FET to the positive port of the selected battery cell via a first resistor and the source of said FET to the negative port of the selected battery cell;
      g(2) connecting a shunt capacitor and a shunt resistor between the gate and source of said FET;
      g(3) connecting a shunt Zener between the gate and source of said FET, for protecting said gate from overvoltage;

g(4) connecting a port of a series capacitor to said gate;
g(5) applying a square wave to the other port of said series capacitor and causing said shunt capacitor to be charged to a voltage that causes said FET to conduct and consume the current that normally charges said battery cell;
g(6) terminating the application of said square wave to said series capacitor whenever the output voltage is not within said threshold; and
g(7) allowing said shunt capacitor discharge via said shunt resistor and cause said FET to stop conducting, thereby returning to measuring the voltage generated across the predetermined resistor with respect to ground.

2. The method for accurately monitoring a charging level of a bank of serially connected battery cells according to claim 1, further comprising feeding the output voltages of all sampled battery cells into a multiplexer, which forwards said output voltages to a processor that outputs the voltages of all sampled battery cells, each at a predetermined timing.

3. The method for accurately monitoring a charging level of a bank of serially connected battery cells according to claim 1, wherein the voltage to current converter is implemented by:
a) providing an operational amplifier, which is suitable to operate in high voltage levels;
b) connecting a negative port of the selected battery cell to an input of said operational amplifier,
c) providing a p-channel FET;
d) connecting a source of said p-channel FET to a positive port of the selected battery cell via a first serial resistor;
e) connecting a drain of said p-channel FET to the ground via a second serial resistor,
f) connecting a gate of said p-channel FET to an output of said operational amplifier; and
g) connecting a feedback line between the source of said p-channel FET and another input of said operational amplifier.

4. The method for accurately monitoring a charging level of a bank of serially connected battery cells according to claim 3, wherein the power supply voltages to feed DC power to the operational amplifier are taken from neighboring battery cells.

5. The method for accurately monitoring a charging level of a bank of serially connected battery cells according to claim 4, wherein the lower DC supply to the operational amplifier is taken from one battery cell being lower than the measured battery cell and the higher upper battery cell and the higher DC supply to said operational amplifier is taken from one battery cell being upper than the measured battery cell.

6. The method for accurately monitoring a charging level of a bank of serially connected battery cells according to claim 5, wherein multiple packages of operational amplifiers are used for measuring groups of battery cells, while each time, taking the lower supply voltage from one battery cell below the measured group, while the remaining lowest battery cell is measured directly, with respect to ground.

7. A battery management system, comprising:
a) a bank of serially connected battery cells having a lower most cell connected to ground and an uppermost cell connected to one port of a load, the other port of which being connected to ground;
b) circuitry for sampling an output voltage of a selected battery cell;
c) a voltage to current converter for receiving the sampled battery cell output voltage, consisting of:
c(1) a current source that outputs current being proportional to said sampled output voltage
c(2) a predetermined resistor, connected between said current source output and ground, into which the output current of said current source is fed;
d) a control circuit, adapted to:
d(1) measure a voltage generated across said predetermined resistor with respect to ground;
d(2) determine whether or not said selected battery cell is fully charged according to a difference between the measured voltage and a predetermined threshold voltage; and
d(3) repeat steps d(1) and d(2) for additional battery cells of said bank; and
e) circuitry for preventing overcharging of the selected battery cell upon measuring that its output voltage is within the threshold, said circuitry comprising:
e(1) a FET the drain of which being connected to the positive port of the selected battery cell via a first resistor and the source of which being connected to the negative port of the selected battery cell;
e(2) a shunt capacitor and a shunt resistor, being connected between the gate and source of said FET; and
e(3) a shunt Zener being connected between the gate and source of said FET, for protecting said gate from overvoltage;
wherein a port of a series capacitor is connected to said gate; and
wherein said circuitry is adapted to:
apply a square wave to the other port of said series capacitor and causing said shunt capacitor to be charged to a voltage that causes said FET to conduct and consume the current that normally charges said battery cell;
terminate the application of said square wave to said series capacitor whenever the output voltage is not within said threshold; and
allow said shunt capacitor discharge via said shunt resistor and cause said FET to stop conducting, to thereby return to measuring the voltage generated across the predetermined resistor with respect to ground.

8. The battery management system according to claim 7, further comprising:
a) a processor, and
b) a multiplexer, which is adapted to receive the output voltages of all sampled battery cells and forward said output voltages to said processor,
said processor outputs the voltages of all sampled battery cells, each at a predetermined timing.

9. The battery management system according to claim 7, further comprising:
a) an operational amplifier, which is suitable to operate in high voltage levels, where a negative port of the selected battery cell is connected to an input of said operational amplifier,
b) a p-channel FET, where a source of said p-channel FET is connected to a positive port of the selected battery cell via a first serial resistor, a drain of said p-channel FET is connected to the ground via a second serial resistor and the gate of said p-channel FET is connected to an output of said operational amplifier, and
c) a feedback line connecting between the source of said p-channel FET and another input of said operational amplifier.

10. The battery management system according to claim 9, in which the power supply voltages to feed DC power to the operational amplifier are taken from the neighboring battery cells.

11. The battery management system according to claim 10, in which the lower DC supply to the operational amplifier is taken from one battery cell being lower than the measured battery cell and the higher upper battery cell and the higher DC supply to said operational amplifier is taken from one battery cell being upper than the measured battery cell.

12. The battery management system according to claim 11, in which multiple packages of operational amplifiers are used for measuring groups of battery cells, while each time, taking the lower supply voltage from one battery cell below the measured group, while the remaining lowest battery cell is measured directly, with respect to ground.

\* \* \* \* \*